(12) United States Patent
Wang et al.

(10) Patent No.: US 12,298,045 B2
(45) Date of Patent: May 13, 2025

(54) REFRIGERANT PUMP AND DATA CENTER COOLING SYSTEM

(71) Applicant: Huawei Digital Power Technologies Co., Ltd., Shenzhen (CN)

(72) Inventors: Hui Wang, Xi'an (CN); Peng Cheng, Xi'an (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 214 days.

(21) Appl. No.: 17/990,076

(22) Filed: Nov. 18, 2022

(65) Prior Publication Data

US 2023/0083147 A1 Mar. 16, 2023

Related U.S. Application Data

(63) Continuation of application No. PCT/CN2020/091111, filed on May 19, 2020.

(51) Int. Cl.
| | |
|---|---|
| *F28F 27/00* | (2006.01) |
| *F25B 25/00* | (2006.01) |
| *F25B 41/00* | (2021.01) |
| *H05K 7/20* | (2006.01) |

(52) U.S. Cl.
CPC .......... *F25B 41/00* (2013.01); *F25B 25/00* (2013.01); *H05K 7/208* (2013.01); *F25B 2400/0401* (2013.01); *F25B 2500/03* (2013.01); *F25B 2600/2501* (2013.01); *F25B 2700/04* (2013.01)

(58) Field of Classification Search
CPC .. F25B 41/00; F25B 25/00; F25B 2400/0401; F25B 2500/03; F25B 2600/2501; F25B 2700/04; H05K 7/208

USPC .............................................. 165/274
See application file for complete search history.

(56) References Cited

U.S. PATENT DOCUMENTS

| 3,221,661 A | 12/1965 | Swearingen |
| 6,145,332 A | 11/2000 | Hyde |
| 2015/0275696 A1 | 10/2015 | Hikichi et al. |

FOREIGN PATENT DOCUMENTS

| CN | 100443723 C | * 12/2008 |
| CN | 102984924 A | 3/2013 |
| CN | 206377872 U | 8/2017 |
| CN | 110044091 A | 7/2019 |
| DE | 0617201 A1 | * 9/1994 |
| DE | 20380319 U1 | * 6/2005 |
| WO | 2013092728 A1 | 6/2013 |

* cited by examiner

*Primary Examiner* — Davis D Hwu
(74) *Attorney, Agent, or Firm* — Maier & Maier, PLLC (57) ABSTRACT

A refrigerant pump and a data center cooling system. The data center cooling system includes a refrigerant connected between a condenser and an evaporator. The refrigerant includes a housing, a partition plate, and a pump head. The housing is provided with a liquid inlet and a liquid outlet. The partition plate is disposed inside the housing, and they jointly form first space and second space. A pump body includes the pump head and a motor. An inlet of the pump head is located at the bottom of the first space in a gravity direction. The motor is located in the second space. The pump head is configured to transfer refrigerant in the first space to the second space. The liquid inlet is directly connected to the condenser by using a pipeline. The first space is configured to store refrigerant of the data center cooling system.

11 Claims, 6 Drawing Sheets

REFRIGERANT PUMP AND DATA CENTER COOLING SYSTEM

CROSS REFERENCE TO RELATED APPLICATION

This application is a continuation of International Application No. PCT/CN 2020/091111, filed on May 19, 2020, the disclosure of which is hereby incorporated by reference in its entirety.

TECHNICAL FIELD

The embodiments relate to the field of refrigeration device technologies, a refrigerant pump, and a cooling system with the refrigerant pump.

BACKGROUND

With rapid development of the information and communications technology (ICT) industry, a quantity and a scale of data centers are also rapidly increasing, and total energy consumption of the data center is also increasingly higher. An air conditioning system accounts for more than 40% of the total energy consumption. Power of a refrigerant pump is far less than power of a compressor. Therefore, in a compression-type refrigeration cycle system, during the winter or when outdoor temperature is low, the refrigerant pump replaces the compressor to transfer low-temperature refrigerant to cool down indoor hot air, so that system energy consumption can be effectively reduced and an energy saving effect is noticeable.

A prerequisite for stable working of the refrigerant pump is that no cavitation occurs. In actual application, a state of refrigerant that arrives at an inlet of the refrigerant pump after passing through a condenser and a liquid receiver is very unstable. When pressure and the temperature fluctuate, the refrigerant at the inlet of the refrigerant pump easily evaporates or flashes to a gaseous state, cavitation occurs in the refrigerant pump, and consequently a system is shut down or the refrigerant pump is faulty.

Therefore, avoiding cavitation is a key to reliable use of the refrigerant pump in the cooling system.

SUMMARY

The embodiments may provide a refrigerant pump and a data center cooling system, to resolve a problem of cavitation at an inlet of the refrigerant pump.

According to a first aspect, an embodiment may provide a refrigerant pump, including a housing and a pump body. The housing is provided with a liquid inlet and a liquid outlet. The housing has a hollow structure. The liquid inlet and the liquid outlet are opening structures on the housing that communicate space inside the housing with the outside of the housing. The housing includes first space and second space that are disposed side by side and that are isolated from each other. Space in the housing may be separated into the first space and the second space by using a built-in partition plate. The liquid inlet communicates with the first space, and the liquid outlet communicates with the second space. The pump body includes a pump head and a motor. An inlet of the pump head is located at the bottom of the first space in a gravity direction. The motor is located in the second space (a position of the motor is not limited, where the motor may be located in the second space, may be located in the first space, or may be located outside the housing, provided that the motor can drive the pump head to work). The pump head is configured to transfer refrigerant in the first space to the second space. The first space is configured to store refrigerant of a cooling system. The liquid inlet is configured to be directly connected to a condenser of the cooling system by using a pipeline. No liquid receiver is additionally disposed between the liquid inlet and the condenser.

The first space may be a liquid storage space, that is, refrigerant other than refrigerant required for current normal working of the data center cooling system is stored in the first space. Because an inlet of the pump head is located at the bottom of the first space in the gravity direction, the liquid refrigerant may directly flow into the inlet of the pump head, and no cavitation occurs. The refrigerant pump has an advantage of high reliability. The refrigerant pump also has a function of a liquid receiver. No liquid receiver needs to be separately disposed in the system, so that the cooling system is more simplified, has a lower cost, and occupies less space. Pipeline configuration of the data center cooling system can also be optimized when the pump body of the refrigerant pump can be protected.

The pump body may be a gear pump, a centrifugal pump, a diaphragm pump, or another type of pump.

In a possible implementation, the first space and the second space are arranged from top to bottom in the gravity direction. The partition plate may be horizontally placed, that is, a plane on which the partition plate is located is approximately in a direction of a horizontal plane. A periphery of the partition plate is connected to a side wall of the housing. A top wall and a bottom wall of the housing are distributed on two opposite sides (which may be understood as an upper side and a lower side in the gravity direction) of the partition plate. The first space is between the top wall and the partition plate, and the second space is between the partition plate and the bottom wall. In this implementation, the first space and the second space are distributed from top to bottom in the gravity direction, so that when the pump head is disposed at any position on the partition plate, an inlet of the pump head can be located at the bottom of the first space in the gravity direction. Therefore, a degree of freedom in structural design is high, thereby further helping avoid cavitation at an inlet position of the pump head.

In a possible implementation, the housing includes a top wall and a bottom wall that are arranged from top to bottom in the gravity direction. Both the first space and the second space are formed between the top wall and the bottom wall. A part of the bottom wall is located at the bottom of the first space, and a part of the bottom wall is located at the bottom of the second space. In this implementation, that the first space and the second space are disposed side by side in a horizontal direction may be understood as follows: The partition plate is disposed vertically, that is, a plane on which the partition plate is located is approximately perpendicular to a direction of a horizontal plane, so that the first space and the second space are respectively on left and right sides of the partition plate. A top edge of the partition plate is connected to the top wall of the housing, and a bottom edge of the partition plate is connected to the bottom of the housing. In this implementation, the pump head is installed at a position that is on the partition plate and that is close to the bottom wall.

In a possible implementation, the refrigerant pump further includes a one-way valve, the one-way valve and the pump head are disposed in parallel between the first space and the second space, and an inlet of the one-way valve is located at the bottom of the first space in the gravity direction. In this implementation, the one-way valve is added between the first space and the second space, so that the one-way valve can implement flow of refrigerant from the first space to the second space. The one-way valve forms a branch in parallel with the pump head. When the pump head works, the refrigerant in the first space may flow to the second space by using the pump head. When the pump head does not work, pressure of the first space is greater than pressure of the second space, and the one-way valve is opened, so that the refrigerant flows from the first space to the second space, and the refrigerant entering the second space flows out through the liquid outlet of the housing.

In a possible implementation, the refrigerant pump further includes a liquid level sensor, and the liquid level sensor is located in the first space. The liquid level sensor is configured to detect a position of a liquid level of the refrigerant in the first space. The liquid level sensor is electrically connected to a control center located outside the housing, to transmit liquid level position information to the control center. When the liquid level is lower than a preset value, the pump head has a risk of cavitation, and the control center controls the pump head to stop working or generates an alarm to prompt work personnel to supplement the refrigerant. A horizontal plane on which the inlet of the pump head is located may be used as a reference for the preset value herein, and the preset value may be the horizontal plane on which the inlet of the pump head is located, or may be higher than the horizontal plane on which the inlet of the pump head is located. The liquid level sensor may be disposed in the first space, so that a state of refrigerant at the inlet position of the pump body can be monitored in real time, thereby facilitating development, testing, and alarm protection during running.

The liquid level sensor may be of a plurality of types such as a float type or a solenoid valve type.

In a possible implementation, a horizontal plane on which the liquid level sensor is located is higher than the horizontal plane on which the inlet position of the pump head is located. The liquid level sensor is disposed at a position higher than the inlet position of the pump head, so that it can be ensured that there is sufficient refrigerant at the inlet position of the pump head, and a risk of cavitation is avoided. In addition, the liquid level sensor can also detect whether a liquid storage amount in the first space meets a pipeline cycle amount of the cooling system.

In a possible implementation, the refrigerant pump further includes a first electrical connector disposed on the housing, the first electrical connector is electrically connected to the liquid level sensor, and the first electrical connector may be electrically connected to the control center by using a cable, so that the liquid level sensor transmits a signal to the control center.

In a possible implementation, the refrigerant pump further includes a filter, and the filter is located in the first space, and is located between the liquid inlet and the inlet of the pump head. The filter is configured to filter out refrigerant impurities. The filter may be installed on a periphery of the pump head and mask the pump head. For example, the pump head is installed on the partition plate inside the housing. Alternatively, the filter may be installed on the partition plate, the filter and the partition plate enclose enclosed space, and the pump head is in the enclosed space. A size of the filter of this architecture is relatively small, provided that the pump head can be masked. In another implementation, the filter may have a mesh structure of a relatively large size. For example, the filter is combined with an inner wall of the housing. The filter separates the first space into two parts. The pump head is located on one side of the filter, and the liquid inlet on the housing is located on the other side of the filter. The filter may be located below the liquid level, or may be located above the liquid level, provided that the refrigerant flowing into the first space through the liquid inlet can pass through the filter.

In a possible implementation, the liquid storage amount in the first space is greater than or equal to 10 liters. The liquid storage amount in the first space may be limited, so that "the amount of refrigerant stored in the first space is a liquid storage amount used for the entire cooling system" can be clearly limited, and the liquid storage amount in the first space is far greater than an amount of refrigerant included in the refrigerant pump that is generally configured to transfer only the refrigerant.

In a possible implementation, the housing of the refrigerant pump further includes a branch opening. The branch opening communicates the first space with the outside of the housing. The branch opening may be located at (but is not limited to) the bottom of the first space in the gravity direction. The branch opening is configured to be connected to a one-way valve branch. In this implementation, no one-way valve is disposed in the housing, and the one-way valve branch is disposed outside the housing. However, the refrigeration liquid of the cooling system first flows into the first space, and then selectively flows to the pump head or the one-way valve branch. That is, the one-way valve branch and the pump body are connected in parallel between the first space and an evaporator.

In a possible implementation, the refrigerant pump further includes a motor configured to drive the pump head, and the motor is disposed in the second space. The second space and the first space are isolated from each other by using the partition plate, the first space is configured to store refrigerant, there is a relatively large amount of refrigerant in the first space, and temperature of a storage environment of the refrigerant needs to be kept stable and appropriate. Therefore, in this implementation, a position for placing the motor may be isolated from the refrigerant, to prevent the temperature of the storage environment of the refrigerant from being affected by heat generated when the motor works. If the motor is placed in the first space, the motor is directly immersed in the refrigerant. When the motor works to generate heat, the refrigerant is directly heated, and consequently the refrigerant may vaporize. The second space is only a path through which the refrigerant flows and does not need to store the refrigerant. The refrigerant entering the second space is output through the liquid outlet at the same time.

According to a second aspect, the embodiments may provide a data center cooling system, including a condenser, an evaporator, and a refrigerant pump connected between the condenser and the evaporator, where refrigerant of the data center cooling system includes working refrigerant and storage refrigerant, the working refrigerant is in a cycle pipeline of the data center cooling system, and the storage refrigerant is stored in first space of the refrigerant pump. In the data center cooling system, no liquid receiver needs to be disposed. When the refrigerant pump according to the first aspect is configured to transfer refrigerant, the refrigerant pump may further store refrigerant, so that not only a problem of cavitation of the refrigerant pump is resolved, but also an overall architecture of the cooling system is simplified, and less space is occupied.

According to a third aspect, the embodiments may provide a data center cooling system, including a refrigerant connected between a condenser and an evaporator, where the refrigerant includes a housing, a partition plate, and a pump head, the housing is provided with a liquid inlet and a liquid outlet, the partition plate is disposed inside the housing, the partition plate and the housing jointly form first space and second space that are disposed side by side and that are isolated from each other, the liquid inlet communicates with the first space, the liquid outlet communicates with the second space, the pump head is connected to the partition plate and is located at the bottom of the first space in a gravity direction, the pump head is configured to transfer refrigerant in the first space to the second space, the liquid inlet is directly connected to the condenser by using a pipeline, and the first space is configured to store refrigerant of the data center cooling system, so that no liquid receiver is additionally disposed in the data center cooling system.

A beneficial effect of the data center cooling system according to the third aspect is the same as that in the second aspect, and details are not described again.

In a possible implementation, a one-way valve is disposed on the partition plate, the one-way valve and the pump head are disposed in parallel between the first space and the second space, and an inlet of the one-way valve is located at the bottom of the first space in the gravity direction.

In this implementation, both the one-way valve and the pump head are installed on the partition plate, so that structural configuration inside the housing of the refrigerant pump is simplified and proper, and a cost of the refrigerant pump is reduced. In addition, no parallel branch needs to be added outside the refrigerant pump, so that a structure of the data center cooling system is also simplified.

In a possible implementation, the refrigerant pump further includes a filter, and the filter is connected to the partition plate and masks the pump head. The filter is fastened to the partition plate, so that the partition plate becomes an installation carrier in the refrigerant pump, and bears most of components, including the pump head, the one-way valve, and the filter. This configuration enables the refrigerant pump to have a simple structure and be easy to assemble.

In a possible implementation, the refrigerant pump further includes a liquid level sensor, and the liquid level sensor is located in the first space.

In a possible implementation, the liquid level sensor is located inside mask space of the filter and is located at an inlet position of the pump head. In this implementation, the liquid level sensor is combined inside the mask space of the filter, so that refrigerant around the liquid level sensor is filtered refrigerant, and has good purity, thereby helping ensure a service life of the liquid level sensor.

In a possible implementation, the liquid level sensor is located outside mask space of the filter and is close to the filter. The liquid level sensor is disposed outside the mask space of the filter, so that both installation and fastening of the liquid level sensor are convenient.

In a possible implementation, the refrigerant pump further includes a motor configured to drive the pump head, and the motor is disposed in the second space.

In a possible implementation, the data center cooling system further includes a compressor and a bypass. The compressor and the bypass are connected in parallel between the condenser and the evaporator. The condenser, the pump head of the refrigerant pump, the evaporator, and the bypass jointly constitute a first cycle path. The condenser, the one-way valve of the refrigerant pump, the evaporator, and the compressor jointly constitute a second cycle path.

DETAILED DESCRIPTION OF THE EMBODIMENTS

The following describes the embodiments with reference to accompanying drawings.

Figure 1:
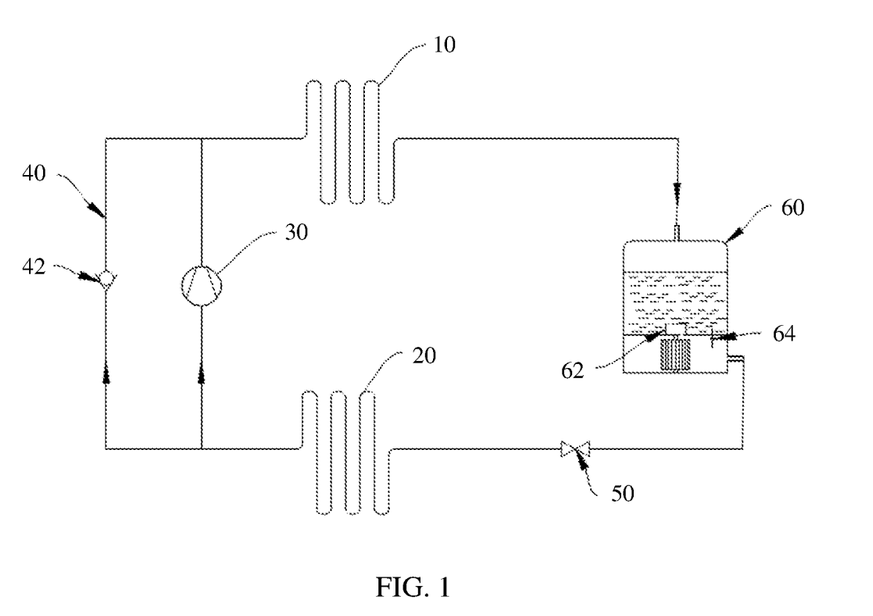
FIG. 1 is a schematic diagram of a data center cooling system according to an implementation.

FIG. 1 is a schematic diagram of a data center cooling system according to an implementation. The data center cooling system includes a condenser 10, an evaporator 20, a compressor 30, a bypass 40, an expansion valve 50, and a refrigerant pump 60. The compressor 30 and the bypass 40 are connected in parallel between the condenser 10 and the evaporator 20 by using a pipeline, and the bypass 40 includes a one-way valve 42. The refrigerant pump 60 is also connected between the condenser 10 and the evaporator 20. When ambient temperature is low, the cooling system can implement heat dissipation without compressing by the compressor 30. In this case, the refrigerant pump 60 provides power to save energy. In this implementation, two branches connected in parallel are disposed in the refrigerant pump 60 and are respectively a pump body branch and a one-way valve branch. A pump body includes a pump head 62 and a motor. The pump head 62 and a one-way valve 64 are disposed in parallel. A refrigerant flow path passing through the pump head 62 is the pump body branch, and a refrigerant flow path passing through the one-way valve 64 is the one-way valve branch. The condenser 10, the pump head 62 of the refrigerant pump 60, the evaporator 20, and the bypass 40 jointly constitute a first cycle path. The condenser 10, the one-way valve 64 of the refrigerant pump 60, the evaporator 20, and the compressor 30 jointly constitute a second cycle path. The first cycle path and the second cycle path are used as required. For example, when ambient temperature is relatively high and the compressor 30 needs to be used, the second cycle path is enabled in the data center cooling system. When ambient temperature is relatively low and a refrigeration function can be implemented by driving refrigerant only by using the refrigerant pump 60, the first cycle path may be enabled.

Figure 2:
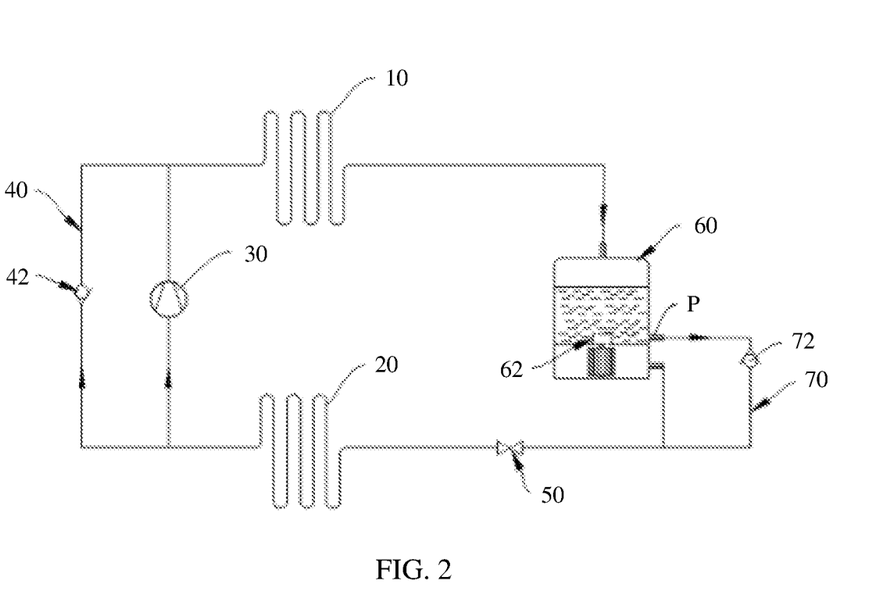
FIG. 2 is a schematic diagram of a data center cooling system according to another implementation.

FIG. 2 is a schematic diagram of a data center cooling system according to another implementation. A difference between this implementation and the implementation shown in FIG. 1 lies in the following: In this implementation, no one-way valve is disposed in a refrigerant pump 60, that is, there is only a pump body branch in the refrigerant pump 60. A one-way valve branch 70 is added outside the refrigerant pump 60, and a one-way valve 72 is disposed on the one-way valve branch 70. A branch opening P may be led from a housing of the refrigerant pump 60. One end of the one-way valve branch 70 is connected to the branch opening P, and the other end of the one-way valve branch 70 is connected to an evaporator 20. When a pump body works, the one-way valve 72 is closed, and refrigerant flows only from the pump body branch to the evaporator 20. When a pump body does not work, refrigerant enters liquid storage space in the refrigerant pump 60 from a condenser 10, and then flows to the one-way valve branch 70 from the branch opening P. The condenser 10, the liquid storage space in the refrigerant pump 60, the pump body, the evaporator 20, and a bypass 40 jointly constitute a first cycle path. The condenser 10, the liquid storage space in the refrigerant pump 60, the one-way valve branch 70, the evaporator 20, and a compressor 30 jointly constitute a second cycle path. In this architecture, the one-way valve branch 70 and the bypass 40 may be in a same pipeline form and are both implemented by connecting a one-way valve in the pipeline. It may be understood that the one-way valve may not be used for the bypass 40, and another valve structure such as a solenoid valve may be used. Similarly, the one-way valve may also be replaced with another valve structure for the one-way valve branch 70.

In the data center cooling systems provided in the two implementations shown in FIG. 1 and FIG. 2, the liquid storage space in the refrigerant pump is used, and no liquid receiver is additionally disposed. The refrigerant pump 60 is directly connected to the condenser 10 by using a pipeline, and no liquid receiver is disposed. However, the refrigerant pump 60 in the system has two functions: liquid storage and providing power to the refrigerant, that is, extra refrigerant is stored in the refrigerant pump 60 when the data center cooling system runs.

Figure 3:
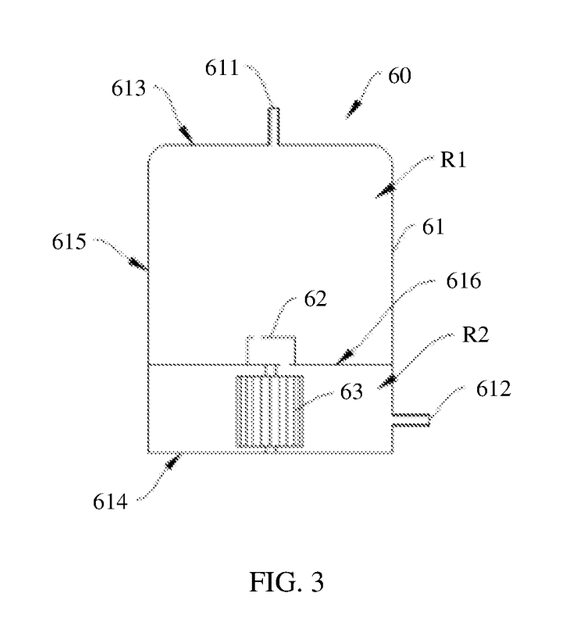
FIG. 3 is a schematic diagram of a refrigerant pump according to an implementation.

As shown in FIG. 3, a refrigerant pump 60 includes a housing 61, a pump head 62 installed in the housing 61, and a motor 63 configured to drive the pump head 62. The pump head 62 and the motor 63 jointly constitute a pump body.

The housing 61 is provided with a liquid inlet 611 and a liquid outlet 612. The housing 61 has a hollow structure. The liquid inlet 611 and the liquid outlet 612 are opening structures on the housing 61 that communicate space inside the housing 61 with the outside of the housing 61. The housing 61 includes first space R1 and second space R2 that are disposed side by side and that are isolated from each other. A pipeline of a cooling system is connected at a position of the liquid inlet 611, and the liquid inlet 611 is connected to a condenser 10 by using the pipeline. A pipeline of the cooling system is connected at a position of the liquid outlet 612, and the liquid outlet 612 is connected to an evaporator 20 by using the pipeline. An expansion valve 50 may be disposed in each of the pipeline between the liquid inlet 611 and the condenser 10 and the pipeline between the liquid outlet 612 and the evaporator 20, but no liquid receiver is disposed, that is, refrigerant directly enters the first space R1 in the housing 61 through the liquid inlet from the condenser 10 by using a pipeline. An inlet of the pump head 62 is located at the bottom of the first space R1 in a gravity direction. The pump head 62 is configured to transfer refrigerant in the first space R1 to the second space R2. The first space R1 is configured to store refrigerant of the cooling system. The liquid inlet 611 is configured to be directly connected to the condenser 10 of the cooling system by using a pipeline. No liquid receiver is additionally disposed between the liquid inlet 611 and the condenser 10.

In a possible implementation, a liquid storage amount in the first space R1 is greater than or equal to 10 liters. The liquid storage amount in the first space R1 may be limited, so that "the amount of refrigerant stored in the first space R1 is a liquid storage amount used for the entire cooling system" can be clearly limited, and the liquid storage amount in the first space R1 is far greater than an amount of refrigerant included in the refrigerant pump 60 that is generally configured to transfer only the refrigerant.

The housing 61 may include a top wall 613, a bottom wall 614, and a side wall 615 connected between the top wall 613 and the bottom wall 614. The top wall 613 and the bottom wall 614 are arranged from top to bottom in the gravity direction.

The entire housing 61 may be, but is not limited to, a cylindrical shape, a cuboid shape, or a spherical shape. The top wall 613 and the bottom wall 614 may have a curved surface structure or a planar structure. Similarly, the side wall 615 may also have a planar structure or a curved surface structure. The side wall 615 may enclose cylindrical space or may enclose square space. A clear boundary may be formed between the side wall 615 and the top wall 613, or the two walls may be coplanar. For example, when the entire housing 61 is a spherical shape or a hemispherical shape, both the top wall 613 and the side wall 615 are curved surfaces with same curvature, to jointly form a spherical surface.

Positions of the liquid inlet 611 and the liquid outlet 612 are not limited to an implementation, provided that it can be ensured that the refrigerant can enter the first space R1 through the liquid inlet 611 and can be output from the refrigerant pump 60 through the liquid outlet 612. Based on different arrangement architectures of the first space R1 and the second space R2, the liquid inlet 611 may be located on the top wall 613 or may be disposed on the side wall 615 or the bottom wall 614, and the liquid outlet 612 may be disposed on the side wall 615 or may be disposed on the bottom wall 614 or the top wall 613.

Space in the housing 61 is separated into the first space R1 and the second space R2 by using a built-in partition plate 616. An edge of the partition plate 616 may be connected to an inner surface of the housing 61 through sealing. In an implementation, the housing 61 may have an integral structure, the edge of the partition plate 616 may be connected to the inner surface of the housing 61 through concave-convex fitting, and a sealant or a sealing gasket may be disposed at a joint. In another implementation, the housing 61 may be divided into two parts. The partition plate 616 and one part of the housing 61 may be integrally formed, and the two parts of the housing 61 are connected and fastened, for example, may be fastened through welding and sealing.

The first space R1 and the second space R2 are arranged from top to bottom in the gravity direction. The partition plate 616 may be horizontally placed, that is, a plane on which the partition plate 616 is located is approximately in a direction of a horizontal plane. A periphery of the partition plate 616 is connected to the side wall 615 of the housing 61. The top wall 613 and the bottom wall 614 of the housing 61 are distributed on two opposite sides (which may be understood as an upper side and a lower side in the gravity direction) of the partition plate 616. The first space R1 is between the top wall 613 and the partition plate 616, and the second space R2 is between the partition plate 616 and the bottom wall 614. In this implementation, the first space R1 and the second space R2 are distributed from top to bottom in the gravity direction, so that when the pump head 62 is disposed at any position on the partition plate 616, the pump head 62 can be located at the bottom of the first space R1 in the gravity direction. Therefore, a degree of freedom in structural design is high, thereby further helping avoid cavitation at an inlet position of the pump head 62.

In this implementation, the motor 63 configured to drive the pump head 62 is disposed in the second space R2, and the motor 63 is installed on the bottom wall 614. The second space R2 and the first space R1 are isolated from each other by using the partition plate 616, the first space R1 is configured to store refrigerant, there is a relatively large amount of refrigerant in the first space R1, and temperature of a storage environment of the refrigerant needs to be kept stable and appropriate. Therefore, in this implementation, a position for placing the motor 63 may be isolated from the refrigerant, to prevent the temperature of the storage environment of the refrigerant from being affected by heat generated when the motor 63 works. If the motor 63 is placed in the first space R1, the motor 63 is directly immersed in the refrigerant. When the motor 63 works to generate heat, the refrigerant is directly heated, and consequently the refrigerant may vaporize. The second space R2 is only a path through which the refrigerant flows and does not need to store the refrigerant. The refrigerant entering the second space R2 is output through the liquid outlet 612 at the same time. Placing the motor 63 in the second space R2 also facilitates a layout of an overall architecture of the refrigerant pump 60. The second space R2 may have a slightly larger size, is not merely configured to transfer the refrigerant, and further needs to accommodate the motor 63. If the second space R2 is located at the bottom of the first space R1 in the gravity direction, the motor 63 is at the bottom, so that a weight proportion of the bottom is increased, thereby ensuring stability of the overall structure of the refrigerant pump 60.

It may be understood that, in another implementation, the motor 63 may be placed in the first space R1, and the motor 63 may be protected, so that heat generated when the motor 63 works is not directly transferred to the refrigerant stored in the first space R1; or independent space for placing the motor 63 is disposed in the first space R1, so that the motor 63 is separated from the refrigerant. In another implementation, the motor 63 may be placed outside the housing 61, and a shaft of the motor 63 extends into the housing 61 to drive the pump head 62, provided that sealing is performed at a joint of the shaft of the motor 63 and the housing 61.

Figure 4:
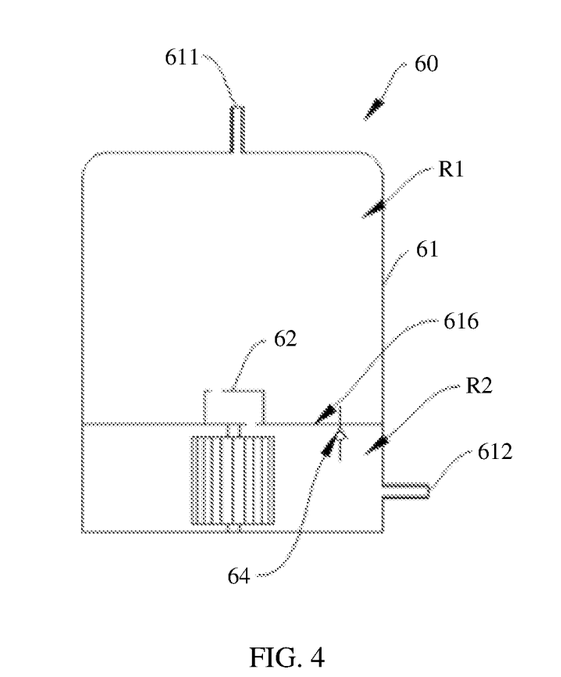
FIG. 4 is a schematic diagram of a refrigerant pump according to an implementation.

As shown in FIG. 4, in the housing 61 of the refrigerant pump 60, two refrigerant flow paths disposed in parallel are formed between the liquid inlet and the liquid outlet 612. One path is for flow from the liquid inlet to the liquid outlet 612 through the pump head 62, and the other path is for flow from the liquid inlet to the liquid outlet 612 through a one-way valve 64.

The one-way valve 64 and the pump head 62 may be disposed in parallel between the first space R1 and the second space R2, and an inlet of the one-way valve 64 may be located at the bottom of the first space R1 in the gravity direction. In this implementation, the one-way valve 64 is added between the first space R1 and the second space R2, so that the one-way valve 64 can implement flow of refrigerant from the first space R1 to the second space R2. The one-way valve 64 forms a branch in parallel with the pump head 62. When the pump head 62 works, the refrigeration liquid in the first space R1 may flow to the second space R2 by using the pump head 62. In this state, the second space R2 is a high pressure area, the first space R1 is a low pressure area, and pressure of the second space R2 is greater than pressure of the first space RE Therefore, the one-way valve 64 cannot input the liquid in the low pressure area into the high pressure area, and the one-way valve 64 does not work.

After the pump head 62 transfers the refrigerant to the second space R2, the refrigerant in the second space R2 flows out through the liquid outlet 612 of the housing 61. When the pump head 62 does not work, pressure of the first space R1 is greater than pressure of the second space R2, and the one-way valve 64 is opened, so that the refrigerant flows from the first space R1 to the second space R2, and the refrigerant entering the second space R2 flows out through the liquid outlet 612 of the housing 61.

Figure 5:
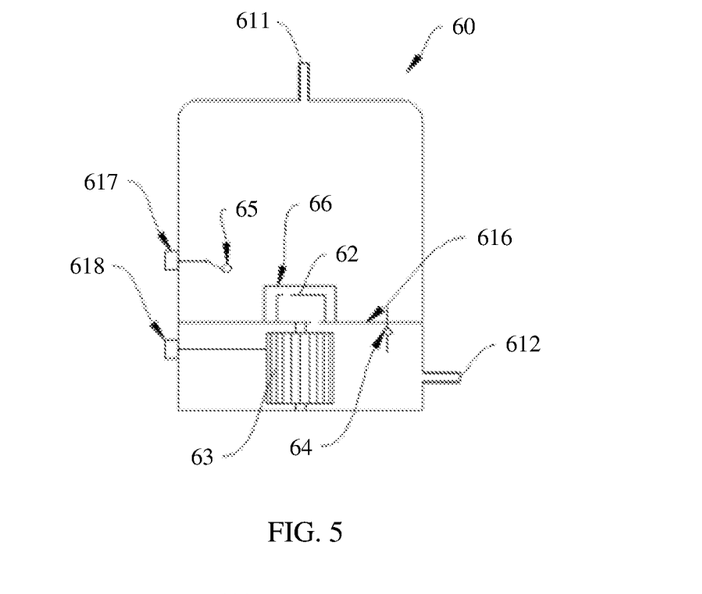
FIG. 5 is a schematic diagram of a refrigerant pump according to an implementation.

As shown in FIG. 5, the refrigerant pump 60 further includes a liquid level sensor 65 and a filter 66. The liquid level sensor 65 and the filter 66 are located in the first space RE The liquid level sensor 65 is configured to detect a position of a liquid level of the refrigerant in the first space RE The liquid level sensor 65 is electrically connected to a control center located outside the housing 61, to transmit liquid level position information to the control center. When the liquid level is lower than a preset value, the pump head 62 has a risk of cavitation, and the control center controls the pump head 62 to stop working or generates an alarm to prompt work personnel to supplement the refrigerant. A horizontal plane on which the inlet of the pump head 62 is located may be used as a reference for the preset value herein, and the preset value may be the horizontal plane on which the inlet of the pump head 62 is located or may be higher than the horizontal plane on which the inlet of the pump head 62 is located.

A horizontal plane on which the liquid level sensor 65 is located is higher than the horizontal plane on which the inlet position of the pump head 62 is located. The liquid level sensor 65 is disposed at a position higher than the inlet position of the pump head 62, so that it can be ensured that there is sufficient refrigerant at the inlet position of the pump head 62, and a risk of cavitation is avoided. In addition, the liquid level sensor 65 can also detect whether the liquid storage amount in the first space R1 meets a pipeline cycle amount of the cooling system.

The filter 66 is located between the liquid inlet 611 and the pump head 62. The filter 66 is configured to filter out impurities to ensure quality of refrigerant entering the inlet of the pump head 62. The filter 66 may be installed on a periphery of the pump head 62 and may mask the pump head 62. For example, the pump head 62 is installed on the partition plate 616 inside the housing 61. Alternatively, the filter 66 may be installed on the partition plate 616, the filter 66 and the partition plate 616 enclose enclosed space, and the pump head 62 is in the enclosed space. A size of the filter 66 of this architecture is relatively small, provided that the pump head 62 can be masked.

Figure 6:
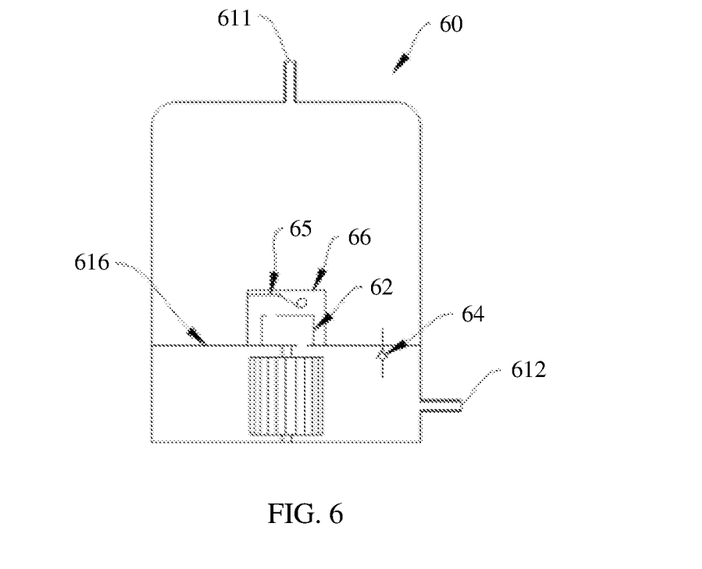
FIG. 6 is a schematic diagram of a refrigerant pump according to an implementation.

As shown in FIG. 6, in an implementation in which the filter 66 masks the pump head 62, the liquid level sensor 65 is located inside mask space of the filter 66 and is located at the inlet position of the pump head 62. The liquid level sensor 65 may be fastened to the filter 66, and the horizontal plane on which the liquid level sensor 65 is located is higher than the horizontal plane on which the inlet of the pump head 62 is located.

Figure 7:
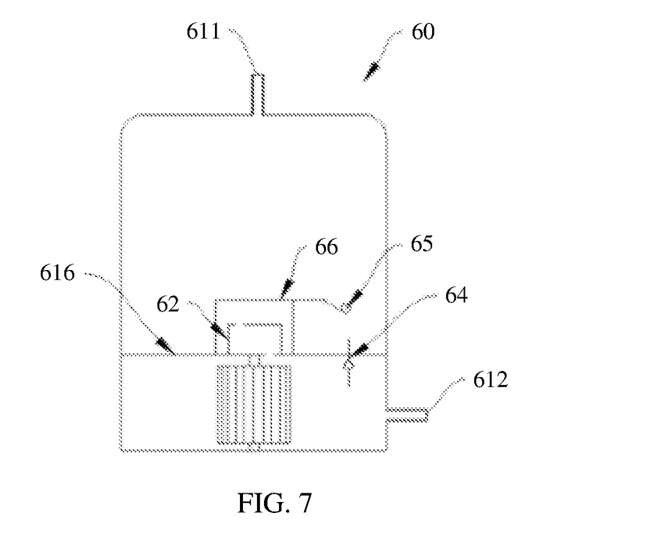
FIG. 7 is a schematic diagram of a refrigerant pump according to an implementation.

As shown in FIG. 7, in an implementation in which the filter 66 masks the pump head 62, the liquid level sensor 65 is located outside mask space of the filter 66 and is close to the filter 66. The liquid level sensor 65 may be fastened to the filter 66 or may be fastened to a bracket in the housing 61.

Figure 8:
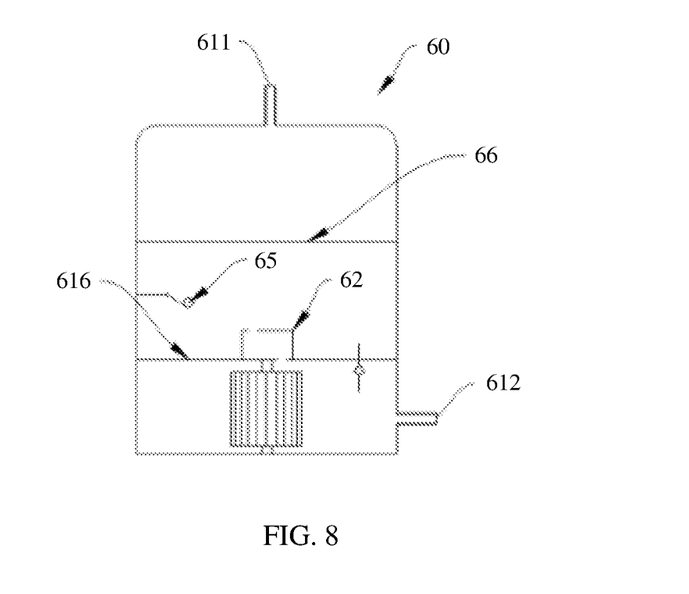
FIG. 8 is a schematic diagram of a refrigerant pump according to an implementation.

In another implementation, refer to FIG. 8. The filter 66 may have a mesh structure of a relatively large size. For example, the filter 66 is combined with an inner wall of the housing 61. The filter 66 separates the first space R1 into two parts. The pump head 62 is located on one side of the filter 66, and the liquid inlet 611 on the housing 61 is located on the other side of the filter 66. The filter 66 may be located below the liquid level, or may be located above the liquid level, provided that the refrigerant flowing into the first space R1 through the liquid inlet 611 can pass through the filter 66. In the implementation shown in FIG. 8, the liquid level sensor 65 is fastened to the inner wall of the housing 61. It may be understood that the liquid level sensor 65 may be fastened to the filter 66, or the liquid level sensor 65 may be fastened to a bracket that extends from the inner wall of the housing 61 towards the first space R1.

Figure 9:
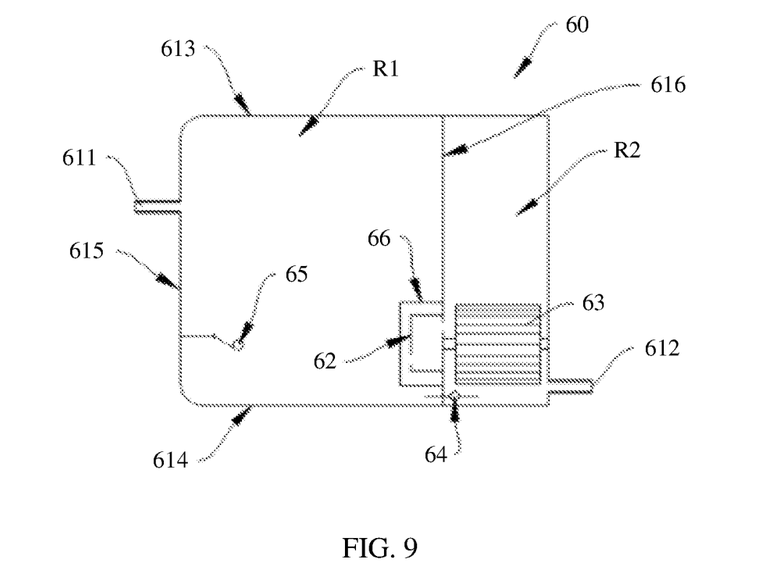
FIG. 9 is a schematic diagram of a refrigerant pump according to an implementation.

As shown in FIG. 9, in a possible implementation, the housing 61 includes a top wall 613 and a bottom wall 614 that are arranged from top to bottom in the gravity direction. Both the first space R1 and the second space R2 are formed between the top wall 613 and the bottom wall 614. A part of the bottom wall 614 is located at the bottom of the first space R1, and a part of the bottom wall 614 is located at the bottom of the second space R2. In this implementation, that the first space R1 and the second space R2 are disposed side by side in a horizontal direction may be understood as follows: The partition plate 616 is disposed vertically, that is, a plane on which the partition plate 616 is located is approximately perpendicular to a direction of a horizontal plane, so that the first space R1 and the second space R2 are respectively on left and right sides of the partition plate 616. A top edge of the partition plate 616 is connected to the top wall 613 of the housing 61, and a bottom edge of the partition plate 616 is connected to the bottom of the housing 61. In this implementation, the pump head 62 is installed at a position that is on the partition plate 616 and that is close to the bottom wall 614. The one-way valve 64 may be located between the pump head 62 and the bottom wall 614, or the one-way valve 64 may be located on a side that is of the pump head 62 and that faces away from the bottom wall 614, provided that it is ensured that a position of the one-way valve 64 is below the liquid level in the first space R1.

In the implementation shown in FIG. 9, both the liquid inlet 611 and the liquid outlet 612 are disposed on the side wall 615, the liquid inlet 611 is close to the top wall 613, and the liquid outlet 612 is close to the bottom wall 614. Additionally, the liquid inlet 611 and the liquid outlet 612 may be disposed at other positions on the housing 61, provided that refrigerant input and output can be met. This is not limited.

As shown in FIG. 5, in a possible implementation, the refrigerant pump 60 further includes a first electrical connector 617 and a second electrical connector 618 that are disposed on the housing 61. The first electrical connector 617 is electrically connected to the liquid level sensor 65, and the first electrical connector 617 may be electrically connected to the control center by using a cable, so that the liquid level sensor 65 transmits a signal to the control center. The second electrical connector 618 is electrically connected to the motor 63. Similarly, the second electrical connector 618 may also be electrically connected to the control center by using a cable. The first electrical connector 617 and the second electrical connector 618 are located on a same side of the housing 61, and such an architecture facilitates wiring.

Figure 10:
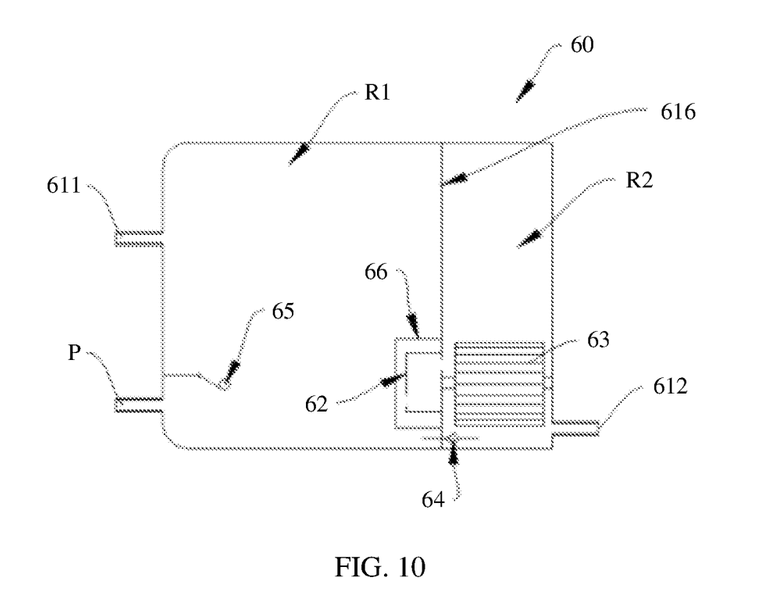
FIG. 10 is a schematic diagram of a refrigerant pump according to an implementation.
Figure 11:
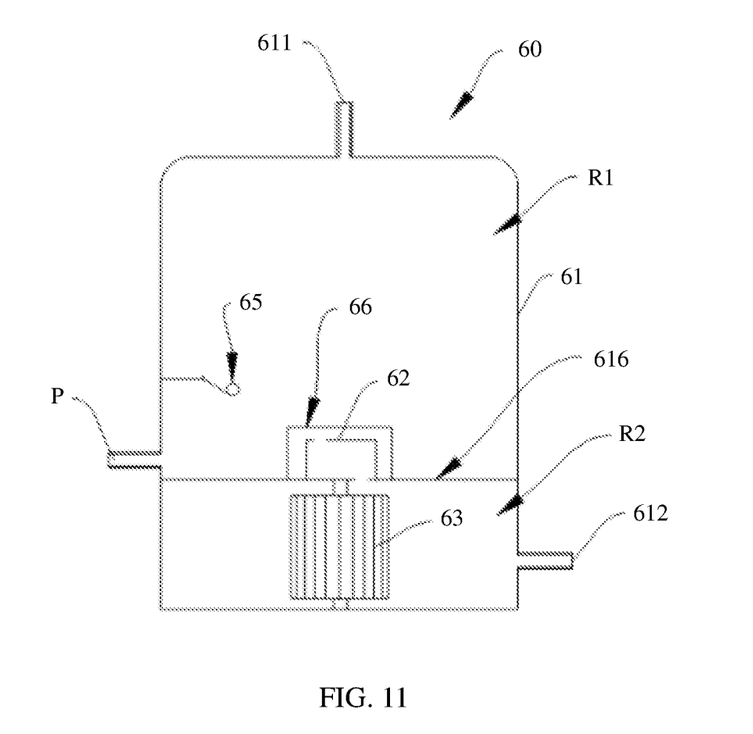
FIG. 11 is a schematic diagram of a refrigerant pump according to an implementation.

In embodiments shown in FIG. 10 and FIG. 11, a branch opening P is further disposed on the housing 61 of the refrigerant pump 60, and the branch opening P communicates the first space R1 with the outside of the housing 61 and is configured to be connected to a one-way valve branch (the one-way valve branch 70 shown in FIG. 2). A structural form of the branch opening P may be the same as forms of the liquid inlet 611 and the liquid outlet 612. For a working principle between the one-way valve branch 70 connected to the branch opening P and the pump body, refer to the foregoing description in FIG. 2. Details are not described again.

The refrigerant pump 60 and the data center cooling system provided in the embodiments are described in detail above. An example is used in this specification to describe the embodiments. The descriptions in the foregoing embodiments are merely used to help understanding. In addition, a person of ordinary skill in the art may make changes in the embodiments. In conclusion, the embodiments should not be construed as limitations.

The invention claimed is:

1. A refrigerant pump, comprising:
   a housing, wherein the housing is provided with a liquid inlet, a liquid outlet, a first space, and a second space that are disposed side by side in the housing and that are isolated from each other, the first space is configured to store refrigerant of a cooling system, and the liquid inlet is configured to be directly connected to a condenser of the cooling system by using a pipeline; and
   a pump head, wherein an inlet of the pump head is located at the bottom of the first space in a gravity direction, the pump head is configured to transfer the refrigerant in the first space to the second space, and the refrigerant in the second space is output through the liquid outlet.

2. The refrigerant pump according to claim 1, wherein the first space and the second space are arranged from top to bottom in the gravity direction.

3. The refrigerant pump according to claim 1, wherein the housing further comprises:
   a top wall and a bottom wall that are arranged from top to bottom in the gravity direction, both the first space and the second space are formed between the top wall and the bottom wall, a part of the bottom wall is located at the bottom of the first space, and a part of the bottom wall is located at the bottom of the second space.

4. The refrigerant pump according to claim 1, further comprising:
   a one-way valve, the one-way valve and the pump head are disposed in parallel between the first space and the second space, and an inlet of the one-way valve is located at the bottom of the first space in the gravity direction.

5. The refrigerant pump according to claim 1, further comprising:
   a liquid level sensor, and the liquid level sensor is located in the first space.

6. The refrigerant pump according to claim 5, wherein a horizontal plane on which the liquid level sensor is located is higher than a horizontal plane on which an inlet position of the pump head is located.

7. The refrigerant pump according to claim 5, further comprising:
   a first electrical connector disposed on the housing, and the first electrical connector is electrically connected to the liquid level sensor.

8. The refrigerant pump according to claim 1, further comprising:
   a filter, and the filter is located in the first space, and is located between the liquid inlet and the inlet of the pump head.

9. The refrigerant pump according to claim 1, wherein a liquid storage amount in the first space is greater than or equal to 10 liters.

10. The refrigerant pump according to claim 1, further comprising:
a motor configured to drive the pump head, and the motor is disposed in the second space.

11. A data center cooling system, comprising a condenser, an evaporator, and the refrigerant pump according to claim 1, wherein the refrigerant pump is connected between the condenser and the evaporator.

* * * * *